(12) United States Patent
Sakashita et al.

(10) Patent No.: US 7,450,419 B2
(45) Date of Patent: Nov. 11, 2008

(54) SEMICONDUCTOR DEVICE AND CONTROL METHOD THEREFOR

(75) Inventors: Mototada Sakashita, Tokyo (JP); Masaru Yano, Tokyo (JP); Akira Ogawa, Tokyo (JP); Tsutomu Nakai, Saitama (JP)

(73) Assignee: Spansion LLC, Sunnyvale, CA (US)

( * ) Notice: Subject to any disclaimer, the term of this patent is extended or adjusted under 35 U.S.C. 154(b) by 39 days.

(21) Appl. No.: 11/636,111

(22) Filed: Dec. 7, 2006

(65) Prior Publication Data

US 2007/0180184 A1 Aug. 2, 2007

Related U.S. Application Data

(63) Continuation of application No. PCT/JP2005/022827, filed on Dec. 13, 2005.

(51) Int. Cl.
G11C 16/06 (2006.01)
G11C 16/10 (2006.01)
G11C 16/32 (2006.01)
G11C 16/24 (2006.01)

(52) U.S. Cl. ............... 365/185.08; 365/189.05; 365/189.17; 365/185.25; 365/189.16; 365/189.07

(58) Field of Classification Search ............ 365/185.08, 365/185.11, 185.25, 189.04, 189.05, 219, 365/220, 221, 227, 230.03, 230.09, 238.5, 365/239, 189.17, 189.16, 189.07
See application file for complete search history.

(56) References Cited

U.S. PATENT DOCUMENTS

| | | | | |
|---|---|---|---|---|
| 5,873,112 A | * | 2/1999 | Norman | 711/103 |
| 6,058,042 A | * | 5/2000 | Nobukata | 365/185.03 |
| 6,388,908 B1 | * | 5/2002 | Araki et al. | 365/45 |
| 6,563,745 B1 | * | 5/2003 | Ilkbahar | 365/189.07 |
| 2003/0046481 A1 | * | 3/2003 | Kushnarenko | 711/103 |
| 2003/0046483 A1 | * | 3/2003 | Moschopoulos | 711/103 |

FOREIGN PATENT DOCUMENTS

| | | |
|---|---|---|
| JP | 62162299 | 7/1987 |
| JP | 5298894 | 11/1993 |
| JP | 11003594 | 1/1999 |
| JP | 2001357682 | 12/2001 |
| JP | 2003249083 | 9/2003 |

* cited by examiner

Primary Examiner—J. H. Hur

(57) ABSTRACT

The present invention provides a semiconductor device and a method for controlling a semiconductor device having a memory cell array having a plurality of nonvolatile memory cells, the method including detecting the number of bits to be written as division data that is divided from data to be programmed into the memory cell array, comparing the number of bits with a predetermined number of bits, inverting or not inverting the division data to produce inversion data in accordance with a result of comparing the number of bits with the predetermined number of bits, and programming the inversion data into the memory cell array. The method further includes detecting the number of bits to be written as next division data and comparing the number of bits of next division data with the predetermined number of bits, while concurrently programming the inversion data into the memory cell array.

19 Claims, 11 Drawing Sheets

SEMICONDUCTOR DEVICE AND CONTROL METHOD THEREFOR

CROSS-REFERENCES TO RELATED APPLICATIONS

This is a continuation in part of International Application No. PCT/JP2005/022827, filed Dec. 13, 2005 which was not published in English under PCT Article 21(2).

FIELD OF THE INVENTION

Embodiments of the present invention relate generally to semiconductors and control methods therefor, and more particularly, to a semiconductor device having nonvolatile memory cells and a control method therefor.

BACKGROUND OF THE INVENTION

In recent years, nonvolatile memory semiconductor devices, in which data is rewritable, have been widely used. In a flash memory that is a typical nonvolatile memory, a transistor composing a memory cell has a floating gate or an insulation film known as charge storage layer. Data is stored by accumulating charges in the charge storage layer.

In NAND flash memories, programming and reading are performed together on a page basis (for example, 2K Bytes). For this reason, there is provided a latch circuit latching data for one page, and the data for one page is programmed into a memory cell array from the latch circuit at the same time. The NAND flash memories generally have memory cells with the floating gates serving as charge storage layers. Writing data into a memory cell is performed by supplying a voltage between a control gate arranged on the floating gate and a substrate. This produces a FN tunneling current to flow across a tunnel oxide film interposed between the charge storage layer and a channel layer, and then the charges (electrons) are stored in the charge storage layer.

Meanwhile, there have been developed Silicon Oxide Nitride Oxide Silicon (SONOS) flash memories, in which charges are stored in a trap layer formed of a silicon nitride film, for a higher storage capacity. In addition, among the flash memories, there have been developed flash memories in which two charge storage regions are provided in the charge storage layer of one transistor. For example, U.S. Pat. No. 6,011,725 discloses a memory cell (transistor) having two charge storage regions arranged between the gate electrode and the semiconductor substrate. This memory cell is a virtual ground memory cell, which symmetrically operates with source and drain thereof interchanged. Also, one memory cell can store two bits. A SONOS flash memory has the same interface with the outside as that of a NOR flash memory. Writing the data into the memory cell is performed by supplying a high voltage to the drain and the control gate. This causes hot electrons to be injected into the charge storage layer, and then the charges (electrons) are stored in the charge storage layer.

Also, for a higher-speed programming, Japanese Patent Application Publication No. 5-298894 and Japanese Patent Application Publication No. 62-162299 propose techniques, by which when the number of bits having data "0" (write state) in the input data is greater than a given number, inverted data of the input data and flag data indicative of the inverted data are programmed into a memory cell.

In nonvolatile memories, writing into the memory cell is performed by injecting charge in the charge storage layer. This makes longer the programming time of the data into the memory cell array. For example, in recent years, with respect to the virtual ground flash memories, studies have been done on the flash memories having a NAND interface. The original NAND flash memories utilize the FN tunneling effect such that a large amount of data for one page can be programmed at the same time. Meanwhile, the virtual ground flash memories employ the hot electron effect to write data such that a large amount of current is needed for writing but only a small amount of data can be written at the same time. Consequently, in the operation of the virtual ground of flash memory with a NAND interface, it is difficult to program data for one page in a short period. Moreover, it is also difficult to read data in the flash memory in a short period.

SUMMARY OF THE INVENTION

The present invention has been made in view of the above circumstances and provides a semiconductor device and a control method therefor, by which a programming time or a reading time into or from a memory cell array can be shortened.

According to a first aspect of the present invention, there is provided a semiconductor device including: a memory cell array comprising a plurality of nonvolatile memory cells; a detection circuit detecting the number of bits to be written as division data that is divided from data to be programmed into the memory cell array and comparing the number of bits with a predetermined number of bits; a latch circuit latching inversion data, which is either the division data inverted or not inverted in accordance with a result of comparing the number of bits with the predetermined number of bits; a write circuit coupled to the latch circuit and programming the inversion data into the memory cell array; and a control circuit coupled to the detection circuit, the latch circuit, and the write circuit to cause the detection circuit to detect the number of bits to be written as next division data and to compare the number of bits of the next division data with the predetermined number of bits, while concurrently controlling the write circuit to program the inversion data into the memory cell array. The division data is divided by the total number of bits to be written and needing a long programming time, and the division data is programmed, thereby shortening the programming time. In addition, while the write circuit is programming the inversion data from the latch circuit into the memory cell array, the detection circuit is detecting the number of bits to be written in the next division data and comparing the total number with a predetermined number. The programming time can be further shortened.

According to a second aspect of the present invention, there is provided a semiconductor device including: a memory cell array comprising a plurality of nonvolatile memory cells; a detection circuit detecting the number of bits to be written as division data that is divided from data to be programmed into the memory cell array and comparing the number of bits with a predetermined number of bits; a latch circuit latching inversion data, which is either the division data inverted or not inverted in accordance with a result of comparing the number of bits with the predetermined number of bits; and a write circuit coupled to the latch circuit and programming the inversion data into the memory cell array. The latch circuit may include a pair of nodes operating in a complementary manner, and latches the inversion data that is either the division data inverted or not inverted by inputting the division data into either of the pair of nodes in accordance with the result of comparing the number of bits with the predetermined number of bits. Data is input into the two nodes operating in a complementary manner, eliminating the necessity of the circuit to invert the division data, and reducing the circuit area.

According to a third aspect of the present invention, there is provided a semiconductor device including: a memory cell array comprising a plurality of nonvolatile memory cells; a read circuit reading division data that is divided from data to be read from the memory cell array; a control circuit determining whether index data indicates that the division data is inverted or not inverted when the division data is programmed; and a latch circuit latching the division data read by the read circuit and outputting inversion data that is either the division data inverted or not inverted in accordance with a result of determining whether the index data indicates that the division data is inverted or not inverted. The read circuit may read next division data from the memory cell array, while the control circuit is determining whether the index data indicates that the division data is inverted or not inverted. When the division data is programmed, it is determined whether the division data is inverted or not inverted. If the division data is inverted, the division data may be changed into the original one and output. In addition, while the control circuit is determining whether the division data is inverted or not inverted when the division data is programmed, the read circuit reads the next division data from the memory cell array. It is possible to shorten the reading time from the memory cell array.

According to a fourth aspect of the present invention, there is provided a semiconductor device including: a memory cell array comprising a plurality of nonvolatile memory cells; a read circuit reading division data that is divided from data to be read from the memory cell array; a control circuit determining whether index data indicates that the division data is inverted or not inverted when the division data is programmed; and a latch circuit latching the division data read by the read circuit and outputting inversion data that is either the division data inverted or that not inverted in accordance with a result of determining whether the index data indicates that the division data is inverted or not inverted. The latch circuit may include a pair of nodes operating in a complementary manner, and outputs the inversion data that is either the division data inverted or not inverted by outputting the division data from either of the pair of nodes in response to the index data. The division data is output from the two nodes operating in a complementary manner, thereby eliminating the necessity of the circuit that inverts the division data and reducing the circuit area.

According to a fifth aspect of the present invention, there is provided a method for controlling a semiconductor device comprising a memory cell array having a plurality of nonvolatile memory cells, the method including: detecting the number of bits to be written as division data that is divided from data to be programmed into the memory cell array; comparing the number of bits with a predetermined number of bits; inverting or not inverting the division data to produce inversion data in accordance with a result of comparing the number of bits with the predetermined number of bits; and programming the inversion data into the memory cell array. Detecting the number of bits to be written as next division data and comparing the number of bits of next division data with the predetermined number of bits, while concurrently programming the inversion data into the memory cell array. It is possible to shorten the programming time into the memory cell array.

According to a sixth aspect of the present invention, there is provided a method for controlling a semiconductor device comprising a memory cell array having a plurality of nonvolatile memory cells, the method including: reading division data that is divided from data to be read from the memory cell array; determining whether index data indicates that the division data is inverted or not inverted when the division data is programmed; and inverting or not inverting the division data in accordance with a result of determining whether the index data indicates that the division data is inverted or not inverted. Reading next division data from the memory cell array is performed, while determining whether the index data indicates that the division data is inverted or not inverted. It is possible to shorten the reading time into the memory cell array.

DESCRIPTION OF THE PREFERRED EMBODIMENTS

A description will now be given, with reference to the accompanying drawings, of embodiments of the present invention.

First Embodiment

A first embodiment of the present invention is an example of a virtual ground flash memory having a NAND interface. The memory cells thereof are virtual ground nonvolatile memory cells, namely, SONOS flash memory cells in which a silicon nitride film serves as a charge storage layer. Two bits can be written into different charge storage regions in the charge storage layer. Hereinafter, "0" represents the state where the charge (electron) is stored in the charge storage region of the memory cell, and "1" represents the state where the charge (electron) is not stored therein. Hereinafter, making the memory cell "0" is referred to as write, and making the memory cell "0" or "1" is referred to as program.

In the flash memory employed in the first embodiment, input or output to or from the outside is performed through the NAND interface, and data is programmed or read on a page basis. In the first embodiment, data for one page is 2K Bytes, for example. The data, however, is programmed or read into or from the memory cell array on division data basis, the division data being the data for one page that is divided into 32. This is because a large amount of current is needed for programming or reading, but only a small amount of data can be written or read at the same time. In addition, in programming the data into the memory cell array, the division data is further divided for writing and writing is performed on further-divided division data for writing basis to reduce the consumption current in programming. Here, when the consumption current does not have to be reduced at the time of programming, the division data does not have to be divided into the further-divided division data for writing, at the time of writing the data into a memory cell array 10.

Hereinafter, normal data denotes data to be written into the memory cell array 10 from an external circuit, and index data denotes a flag indicative of whether or not the data is inverted for programming, described later. The division data is the normal data for one page that is divided, and corresponding index data denotes index data to be programmed or read simultaneously with the division data. In the first embodiment, for example, the size of the division data is 512 bits, the size of the corresponding index data is 4 bits, the size of the further-divided division data for writing is 128 bits, and the size of the corresponding index data is 1 bit. However, the present invention is not limited to the aforementioned sizes.

Figure 1:
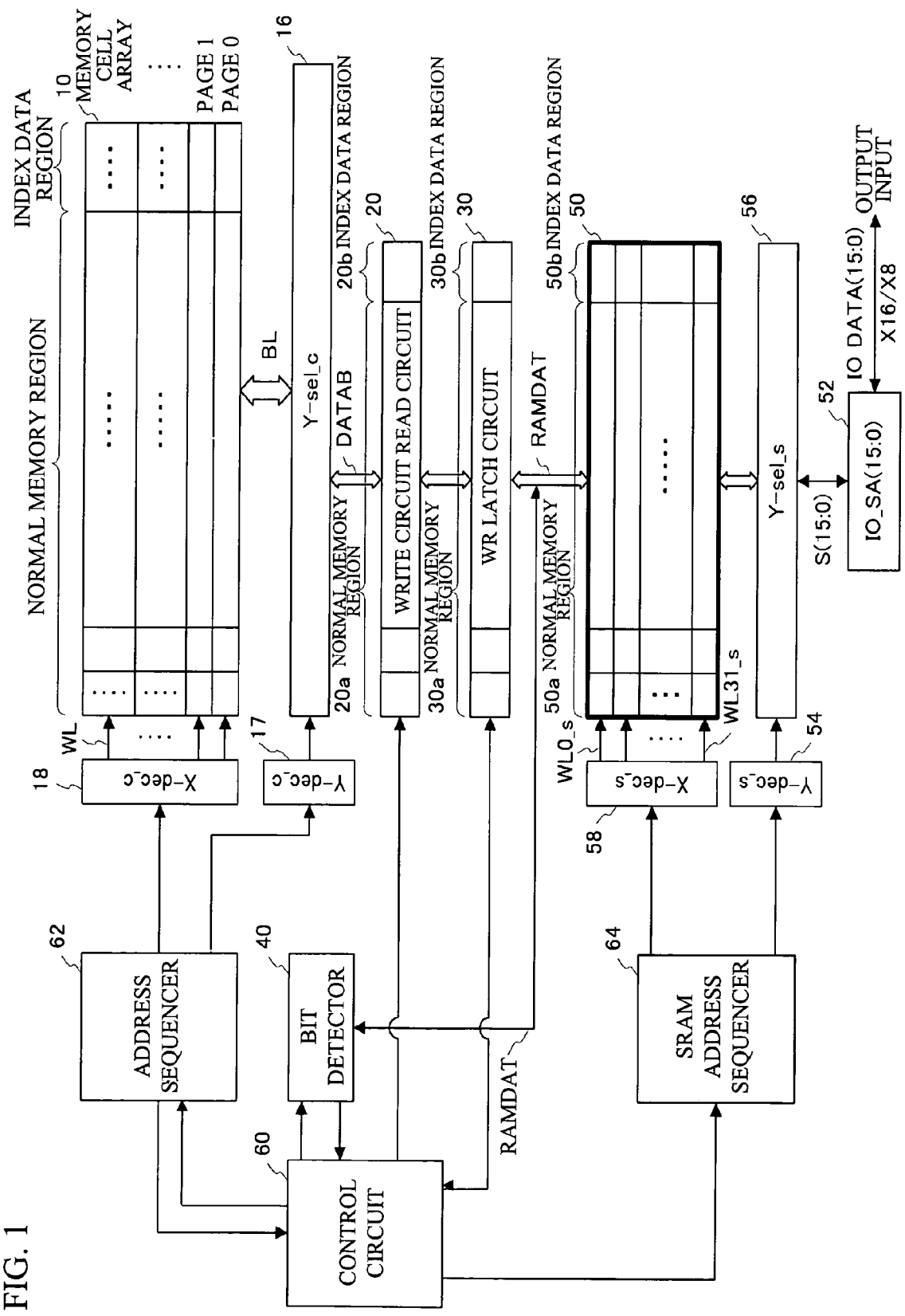
FIG. 1 is a block diagram in the periphery of a memory cell array of a flash memory in accordance with a first embodiment of the present invention.
Figure 2:
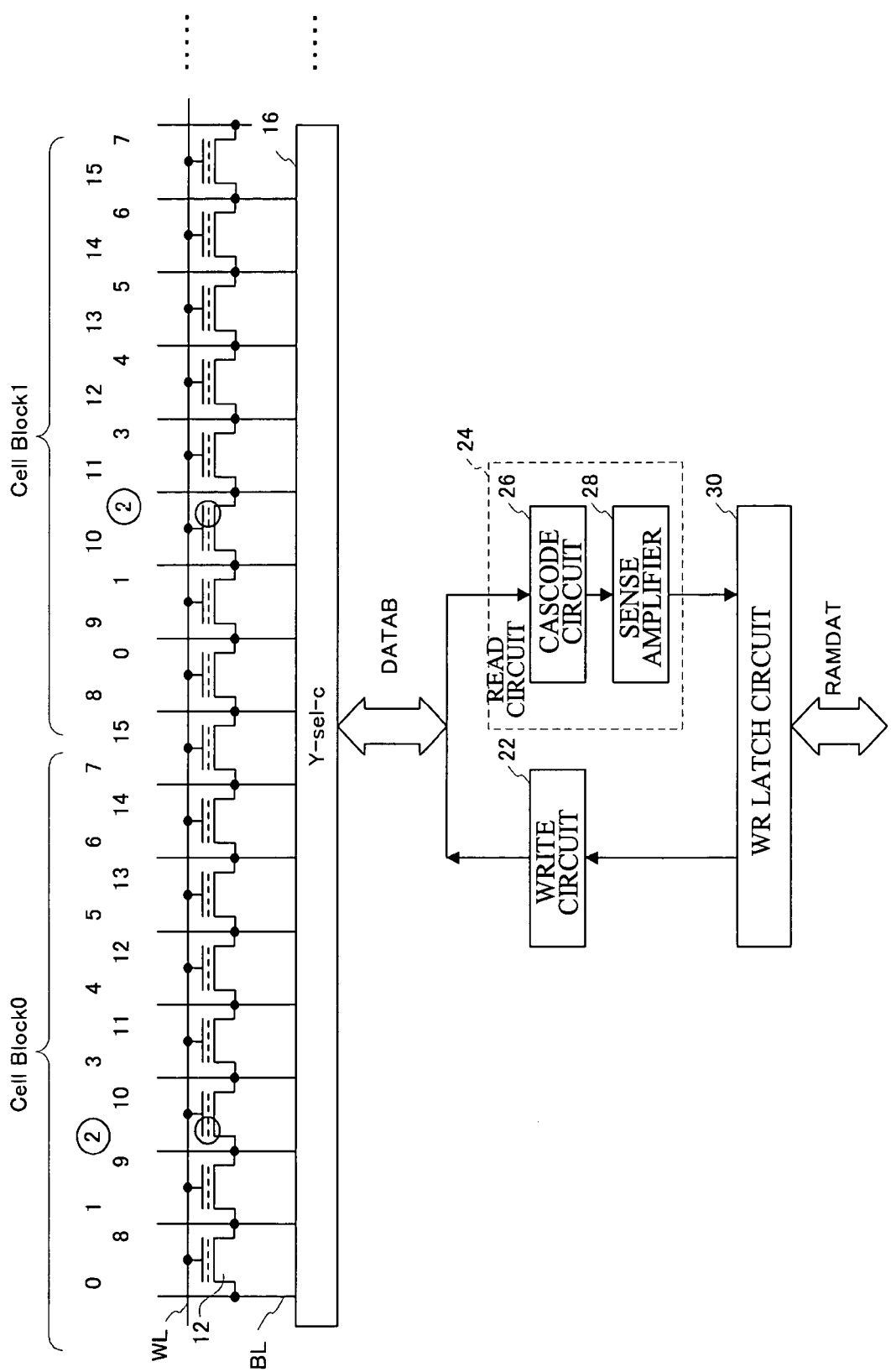
FIG. 2 is a circuit diagram depicting a connection to memory cells.

FIG. 1 is a block diagram in the periphery of the memory cell array 10 of the flash memory in accordance with the first embodiment of the present invention. FIG. 2 is a view depicting a connection to the memory cells. Referring to FIG. 1, the memory cell array 10 includes multiple memory cells (not shown) arranged in a matrix shape along multiple word lines (not shown) extending in a lateral direction and multiple bit lines (not shown) extending in a longitudinal direction. Referring to FIG. 2, a word line WL is connected to the control gate of the transistor that composes a memory cell 12, and bit lines BL are connected to sources and drains thereof. The region connected to an identical word line (in practice, there are two word lines, as will be described later) corresponds to a page that stores the data for one page.

Referring back to FIG. 1, there are provided regions for multiple pages in a longitudinal direction. In this manner, the memory cell array 10 has multiple pages. The region for one page includes a normal memory region and an index data region. The normal memory region is a region to store the normal data. The index data region is the region to store the index data. The region for one page also includes: a reference cell region having a cell used as a reference when the data is read; and a spare region having a cell in which file management data is stored. However, a description thereof will be omitted, in the following description.

An X-dec_c 18 is an X decoder, and is a circuit to select the word line WL of the memory cell array 10. A Y-sel_c 16 is a circuit coupled through the bit line BL to the memory cell array 10 to select the memory cell 12 on division data basis (512 bits) and on corresponding index data basis (4 bits), out of the page data. A Y-dec_c 17 is a Y decoder, and controls the Y-sel_c 16 to select the bit line. An address sequencer 62 is a circuit to give an instruction on an address to the X-dec_c 18, the Y-dec_c 17, and a control circuit 60.

A write circuit/read circuit 20 is a circuit coupled to the Y-sel_c 16 by a data line DATAB to program the data latched at a WR latch circuit 30 into the memory cell array 10 and to output to the WR latch circuit 30, the division data and the corresponding index data, out of the data stored in the memory cell array 10. The write circuit/read circuit 20 has a normal memory region 20a for the division data and an index data region 20b for the corresponding index data. The WR latch circuit 30 is a circuit that temporarily retains the division data and the corresponding index data to be programmed or read into or from the memory cell array 10. Also, the WR latch circuit 30 is a circuit that converts the division data in accordance with the index data. The WR latch circuit 30 has: a normal memory region 30a that latches the division data; and an index data region 30b that latches the corresponding index data. The write circuit/read circuit 20 and the WR latch circuit 30 correspond to circuits for one division data (512 bits) and the corresponding index data (4 bits).

An SRAM array 50 is a volatile memory cell array, and is coupled through a RAMDAT to the WR latch circuit 30 and coupled through a Y-sel_s 56 to an IO_SA(15:0) 52. The SRAM array 50 has SRAM cells arranged in an array. The SRAM cells coupled to an identical word line (of an identical line) correspond to the division data and the corresponding index data. That is to say, there are provided in one line, one SRAM cell for the 512-bit normal data and the other SRAM cell for 4-bit index data, and there are provided 32 lines in a longitudinal direction of the drawing. In this manner, 2K-Byte SRAM cells for one page are allocated in the SRAM array 50. The SRAM array 50 includes a normal memory region 50a and an index data region 50b corresponding to the memory cell array 10. An X-dec_s 58 is an X decoder of the SRAM array 50 that selects word lines WL0_s through WL32_s of the SRAM array 50. The Y-sel_s 56 selects the bit line of the SRAM array 50 and transfers the data to the IO_SA(15:0) 52, in response to an instruction given from an Y-dec_s 54. An SRAM array address sequencer 64 is a circuit that gives an instruction on the address of the SRAM array to the X-dec_s 58 and the Y-dec_s 54.

A bit detector 40 is a circuit coupled to the RAMDAT to detect (namely, count) the total number of "0" in the division data on the RAMDAT, the division data being output from the SRAM array 50, to compare the total number of the bits of "0", and to output a comparison result to the WR latch circuit 30, as the corresponding index data. The control circuit 60 is a circuit that controls the bit detector 40, the WR latch circuit 30, the write circuit/read circuit 20, and the SRAM array address sequencer 64.

Referring to FIG. 2, the memory cell 12 composes a cell block, which is a minimum decoding unit in eight cells. 2-bit, left and right, data can be stored in one cell. The addresses of 0-7 are assigned to the left bits, and the addresses of 8-15 are assigned to the right bits respectively, in the memory cell 12 of a cell block 0. In the memory cell 12 of a cell block 1 adjacently arranged, the addresses of 0-7 are assigned to the right bits, and the addresses of 8-15 are assigned to the left bits respectively. The addresses are symmetrically assigned to adjacent cell blocks in this manner in order to suppress the leak current between adjacent cell blocks. There are 516 cell blocks (that is, provided for the division data and the corresponding index data) coupled to one word line WL. The number of the cell blocks coupled to two word lines is 1032, and 1032 is multiplied by 16 bit, 1032×16 bits corresponds to approximately 2K Bytes for one page. The same address in each cell block, for example, 516 pieces of data of an address 2 compose 516-bit division data and corresponding index data. The address in each cell block is selected by the Y-sel_c 16, and is coupled through the DATAB to a write circuit 22 and a read circuit 24 of the write circuit/read circuit 20.

The read circuit 24 includes a cascode circuit 26 and a sense amplifier 28. The cascode circuit 26 is a circuit that converts current flowing through the memory cell 12 into voltage, when the data is read from the memory cell 12. The sense amplifier 28 is a circuit that compares the voltage corresponding to the current of the memory cell 12 with the voltage of the reference cell and outputs "0" or "1". An output from the sense amplifier 28 is latched by the WR latch circuit 30, and is output through the RAMDAT to the SRAM array 50. When the data is programmed into the memory cell 12, the data output from the SRAM array 50, on the RAMDAT, is to be latched by the WR latch circuit 30. The data latched by the WR latch circuit 30 is output to the write circuit 22. The write circuit 22 is a circuit that programs the data into the memory cell 12 and that programs the output from the WR latch circuit 30 through the DATAB into the memory cell 12. One DATAB, one write circuit 22, one read circuit 24, one WR latch circuit 30, and one RAMDAT are respectively provided for each cell block. That is to say, there are respectively provided 516 DATABs, 516 write circuits 22, 516 read circuits 24, 516 WR latch circuits 30, and 516 RAMDATs.

Figure 3:
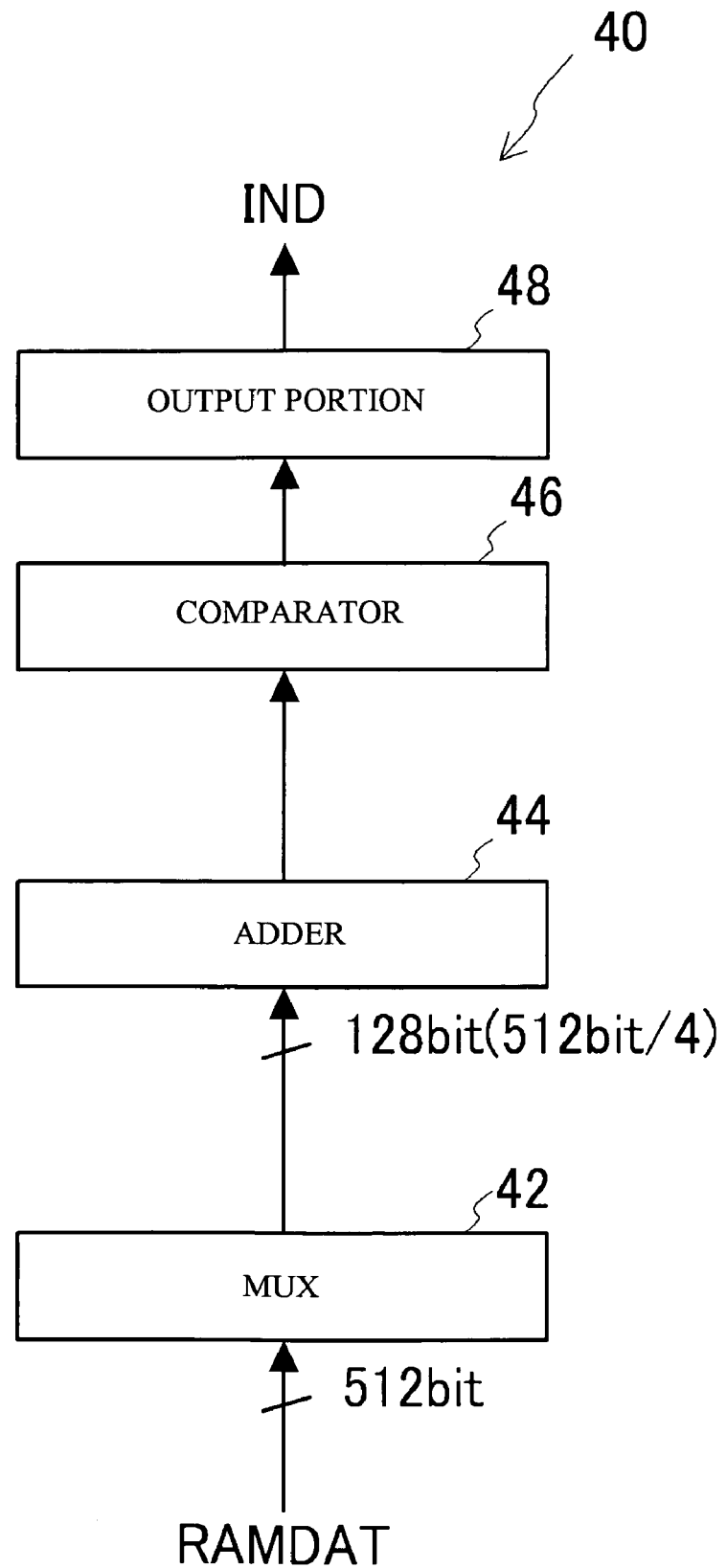
FIG. 3 is a block diagram of a bit detector.

FIG. 3 is a block diagram of the bit detector 40. The bit detector 40 is a circuit that counts the total number of bits "0" in the data to write charge into the charge storage layer of the memory cell, out of the data in the RAMDAT, and controls the WR latch circuit 30 in accordance with the result. Referring to FIG. 3, the bit detector 40 includes: a MUX 42 that further divides the division data into the further-divided division data for writing; an adder 44 that detects the data "0" in the further-divided division data for writing, to write the charge into the charge storage layer; a comparator 46 that compares the total number of bits detected by the adder 44 with a predetermined number; and an output portion 48 that outputs a flag indicative of whether or not the data should be inverted in accordance with the comparison result of the comparator 46. When the data is inverted, "0" is written into index data IND.

At the time of programming data into the memory cell array 10, when the number of "0" in 128 bits of the further-divided division data for writing is greater than 64 bits, 128 bits of the further-divided division data for writing are inverted. For example, it is assumed that there are 70 bits of "0" in 128 bits of the further-divided division data for writing on the RAMDAT. In the aforementioned case, the adder 44 counts the number of "0", and the comparator 46 compares whether such counted number is greater than 64 bits. In this example, the number of "0" is greater than 64 bits, the index data IND, which is an output from the output portion 48, is set to "0". 70 pieces of the data "0" in the RAMDAT are inverted, described later, and latched at the WR latch circuit 30. Accordingly, no charge is written into the charge storage regions of the memory cells in the aforementioned bits.

Meanwhile, the remaining 58 bits of data "1" are inverted in a similar manner, and are latched by the WR latch circuit 30. Charges are written into the charge storage layers in the memory cells in the above-described bits. The index data IND of "0" is output. In consequence, the number of the bits "0" is 59 bits, 59 bits=58 bits (normal data)+1 bit (index data), in which charges are written into the charge storage layers in the memory cells. If the aforementioned inversion process is not performed, the number of the bits "0" is 70 bits, 70 bits=70 bits+0 bit, in which charges are written into the charge storage layers in the memory cells. As stated heretofore, it is possible to reduce the number of bits "0", into which the data is written, and to reduce the programming time and the write current, by performing the data inversion process. Here, in the first embodiment, 64 bits, which is a half of the further-divided division data for writing, is set to a reference value in the determination of whether or not the data should be inverted. However, the reference value may be set in consideration of the programming time and the write current.

Figure 4:
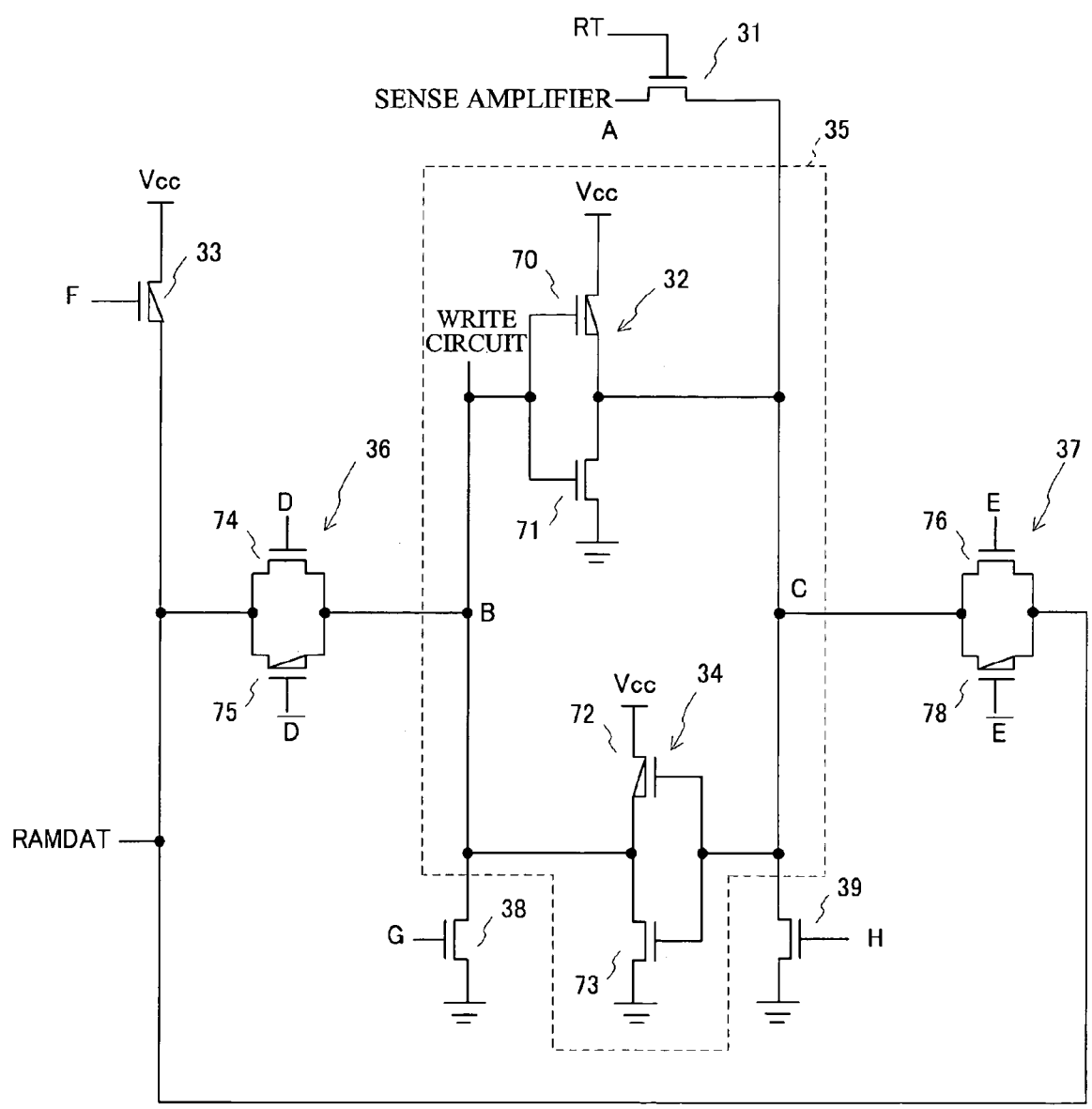
FIG. 4 is a WR latch circuit.

FIG. 4 is a circuit diagram of the WR latch circuit 30. The output from the sense amplifier 28 is connected to a node A, and is input through an N-FET 31 into a node C of a latch 35. An N-FET 31 is a switch that connects the output from the sense amplifier 28 to the latch 35 and transfers the division data to the latch 35. The latch 35 is composed of: an inverter 32 formed of a P-FET 70 and an N-FET 71; and an inverter 34 formed of a P-FET 72 and an N-FET 73. A node B and the node C of the latch 35 operate in a complementary manner. That is to say, when the node B is at a high level, the node C is at a low level. When the node B is at a low level, the node C is at a high level. The node B is connected to a write circuit 22. In order to reduce the area of the latch 35, the P-FET 70 and the P-FET 72 respectively composing the inverters 32 and 34 substantially have the same transistor width W, and the N-FET 71 and the N-FET 73 respectively composing the inverters 32 and 34 substantially have the same transistor width W. The current of the P-FET becomes smaller due to the difference in electron mobility between the N-FET and the P-FET. Therefore, when the data is input into the node C of the latch 35, it is difficult to set the node C from a low level to a high level. Similarly, when the data is input into the node B of the latch 35, it is difficult to set the node B from a low level to a high level. For this reason, the data is input into the latch 35, after a node G connected to the gate of an N-FET 38 or a node H connected to the gate of an N-FET 39 is set at a high level in advance.

The node B is connected through a transfer gate 36 composed of an N-FET 74 and a P-FET 75, to the RAMDAT. The node C is connected through a transfer gate 37 composed of an N-FET 76 and a P-FET 78, to the RAMDAT. The transfer gates 36 and 37 are opened when the nodes D and E are respectively at a high level, and are closed when the nodes D and E are respectively at a low level. As stated, the transfer gates 36 and 37 are switches that connect the output from the SRAM array 50, namely the data on the RAMDAT, and the latch 35 so as to transfer the division data to the latch 35. A P-FET 33 is a switch that activates the WR latch circuit 30 by setting a node F at a low level.

Figure 5:
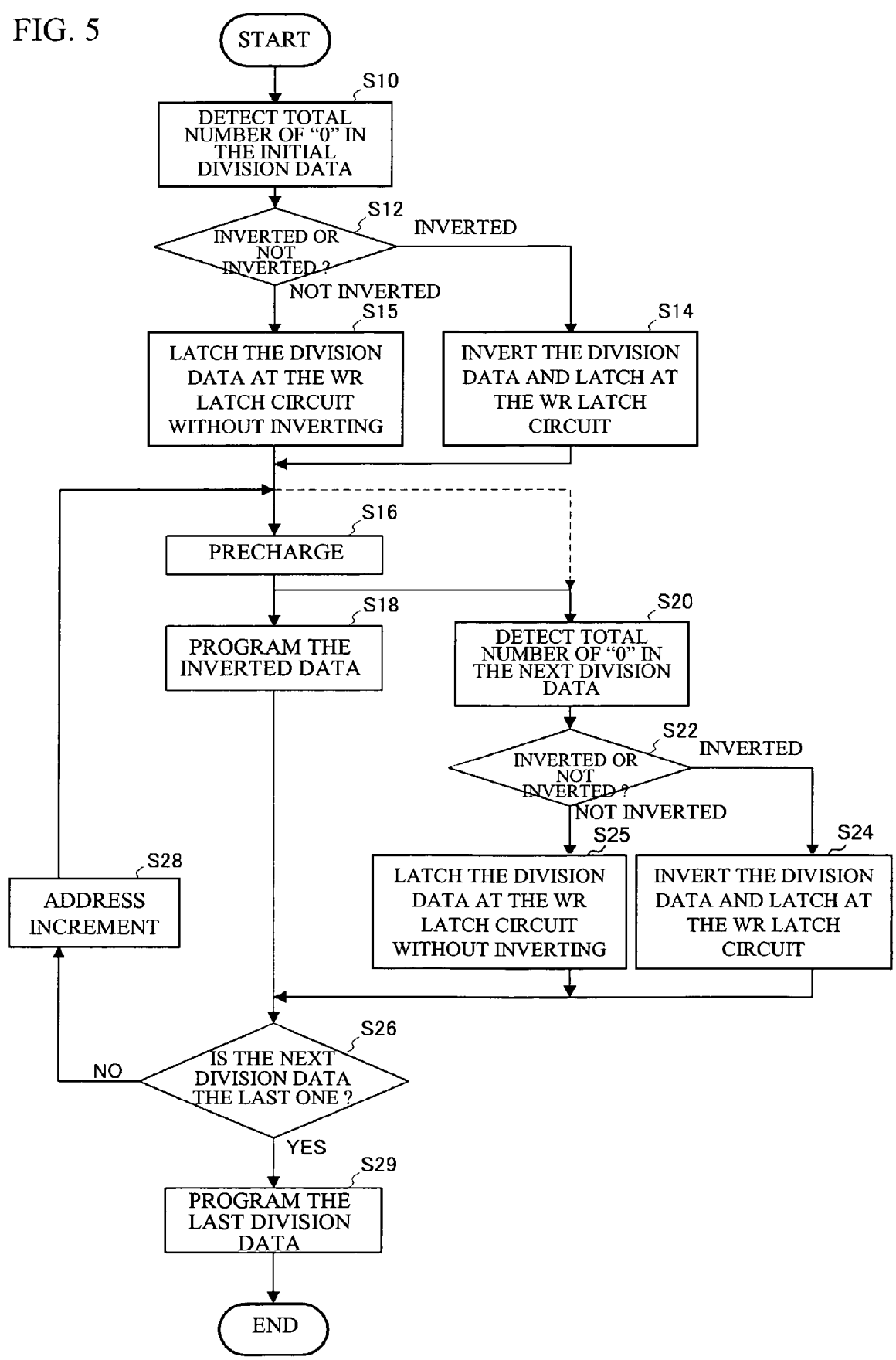
FIG. 5 is a flowchart of writing data into the memory cell array.
Figure 6:
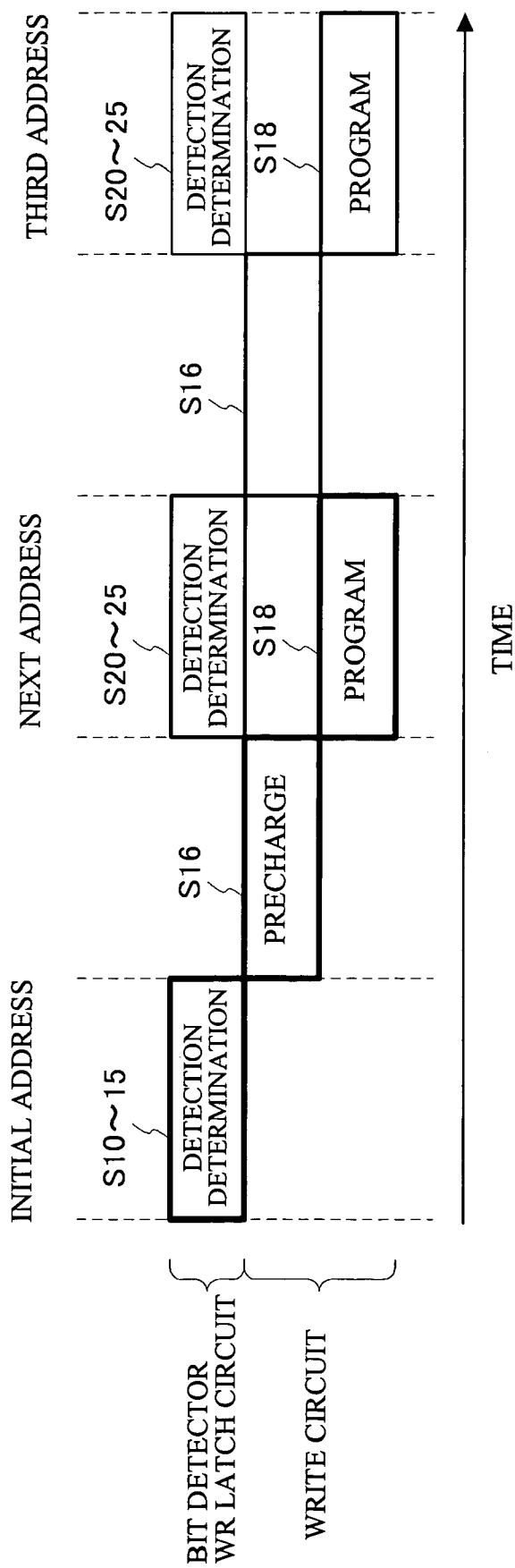
FIG. 6 is a timing chart of writing data into the memory cell array.

Next, a description will be given of a process flow when the data for one page is programmed into the memory cell array 10. FIG. 5 is a flowchart of programming data, and FIG. 6 is a timing chart thereof. The following process flow is performed with the node D and the node E kept at a low level, namely, with the transfer gates 36 and 37 kept closed (off). Referring to FIG. 1, the data for one page to be programmed into the memory cell array is input into the IO_SA(15:0) 52 as data IO DATA(15:0) on a 16-bit input bus width basis, from an external circuit, and it is retained in the SRAM array as S(15:0). The control circuit 60 gives an instruction to the SRAM array address sequencer 64 to output to the RAMDAT, the division data of the initial address of the SRAM array 50.

Referring to FIG. 5, the bit detector 40 detects the total number of "0" in one further-divided division data for writing (128 bits) out of the division data (512 bits) in the RAMDAT (step S10), and determines whether the number of "0" is greater than 64 bits. If the number of "0" in the further-divided division data for writing is greater than 64, the bit detector 40 sets the corresponding index data to "0" to invert the further-divided division data for writing. If the number of "0" in the further-divided division data for writing is equal to or smaller than 64, the bit detector 40 sets the corresponding index data to "1" not to invert the further-divided division data for writing. In other words, the bit detector 40 determines whether or not the further-divided division data for writing should be inverted (step S12).

When the further-divided division data for writing is inverted, namely, when the index data is "0", the WR latch circuit 30 inverts the further-divided division data for writing and latches such inverted further-divided division data for writing (step S14). Referring to FIG. 4, the following operation is performed to invert and latch the further-divided division data for writing. The node G is set at a high level, the node B is set at a low level, and the node C is set at a high level. Subsequently, the node G is set at a low level, and the FET 38 is turned off. Then, the node E is set at a high level to open the transfer gate 37 (is turned on) with the node D kept at a low level, namely, with the transfer gate 36 kept closed. This causes the data on the RAMDAT to be input into the node C, and such input data is latched by the latch 35. Since the node B and the node C operate at complementary levels, when the node B is connected to the write circuit 22 in a subsequent process, such inverted data is output to the write circuit 22. In this manner, the further-divided division data for writing is inverted and latched by the WR latch circuit 30. The node E is set at a low level, and the transfer gate 37 is closed (turned off).

Referring back to FIG. 5, when the further-divided division data for writing is not inverted at step S12, namely, when the index data is "1", the WR latch circuit 30 latches the further-divided division data for writing without inverting (step S15). Referring to FIG. 4, the following operation is performed to latch the further-divided division data for writing without inverting the data. The node H is set at a high level, the node C is set at a low level, and the node B is set at a high level. Subsequently, the node H is set at a low level, and the FET 39 is turned off. Then, the node D is set at a high level to open the transfer gate 36 (is turned on) with the node E kept at a low level, namely, with the transfer gate 37 kept closed (off). This causes the data on the RAMDAT to be input into the node B, and the data is latched by the latch 35. When the node B is connected to the write circuit 22 in a subsequent process, the data that is not inverted is output to the write circuit 22. The node D is set at a low level, and the transfer gate 36 is closed (turned off).

As stated heretofore, the division data is inverted or is not inverted on 128 bits of the further-divided division data for writing basis. The flag indicative of whether the further-divided division data for writing is inverted or not inverted is stored in the 1 bit of the corresponding index data. 512 bits of the division data are latched by the WR latch circuit 30 by implementing step S10 through step S15 four times. In FIG. 5, for simplification, every step for the further-divided division data for writing is omitted. The bit detector 40 may detect the total number of "0" in the whole division data of 512 bits. In such case, all pieces of the index data corresponding to all pieces of the further-divided division data for writing are produced at step S10 so as to be referred to whenever the programming operation for each of the further-divided division data for writing is performed in a subsequent process. Referring to FIG. 6, the bit detector 40 detects the number of "0" in the division data of the initial address, and determines whether or not the division data should be inverted. The WR latch circuit 30 inverts or does not invert the division data to be latched by the latch 35 (S10 through S15: detection, determination). Hereinafter, the division data inverted or not inverted is referred to as inversion data.

Referring to FIG. 5 and FIG. 6, the WR latch circuit 30 outputs to the write circuit 22, the inversion data latched by the latch 35 and the corresponding index data. The write circuit 22 precharges the bit line to be connected to the memory cell into which the inversion data and the corresponding index data are to be programmed (step S16: precharge). Precharge is a step of increasing the speed of the programming operation by charging the bit line up to the power supply voltage, before a high voltage is supplied to the bit line in programming. Therefore, precharge may be omitted for simplification. Next, step S20 through step S25 are implemented, while step S18 is being implemented. That is, the write circuit 22 programs the inversion data of the initial address and the corresponding index data into the memory cell of the memory cell array 10 (step S18: program). In the meantime, the control circuit 60 gives an instruction to the SRAM array address sequencer 64 to output to the RAMDAT, the division data of the next address in the SRAM array 50. The bit detector 40 detects the number of "0" in the next division data (step S20). The bit detector 40 determines whether or not the division data should be inverted (step S22). If it is determined that the division data should be inverted, the WR latch circuit 30 inverts the division data and latches as the inversion data (step S24). If it is determined that the division data should not be inverted, the WR latch circuit 30 does not invert the division data and latches as the inversion data (step S25). As stated heretofore, step S20 through step S25 correspond to the detection and determination in FIG. 6. The control circuit 60 determines whether or not the next division data is a last one (step S26). If it is No, the control circuit 60 increments the address (step S28), and processing goes to step S16. If it is Yes, the write circuit 22 precharges the bit line to be connected to the memory cell, into which the last division data (inversion data) is to be programmed, and programs the last division data (inversion data) into the memory cell of the memory cell array 10 (step S29). In this manner, the data for one page is programmed into the memory cell array 10.

Figure 7:
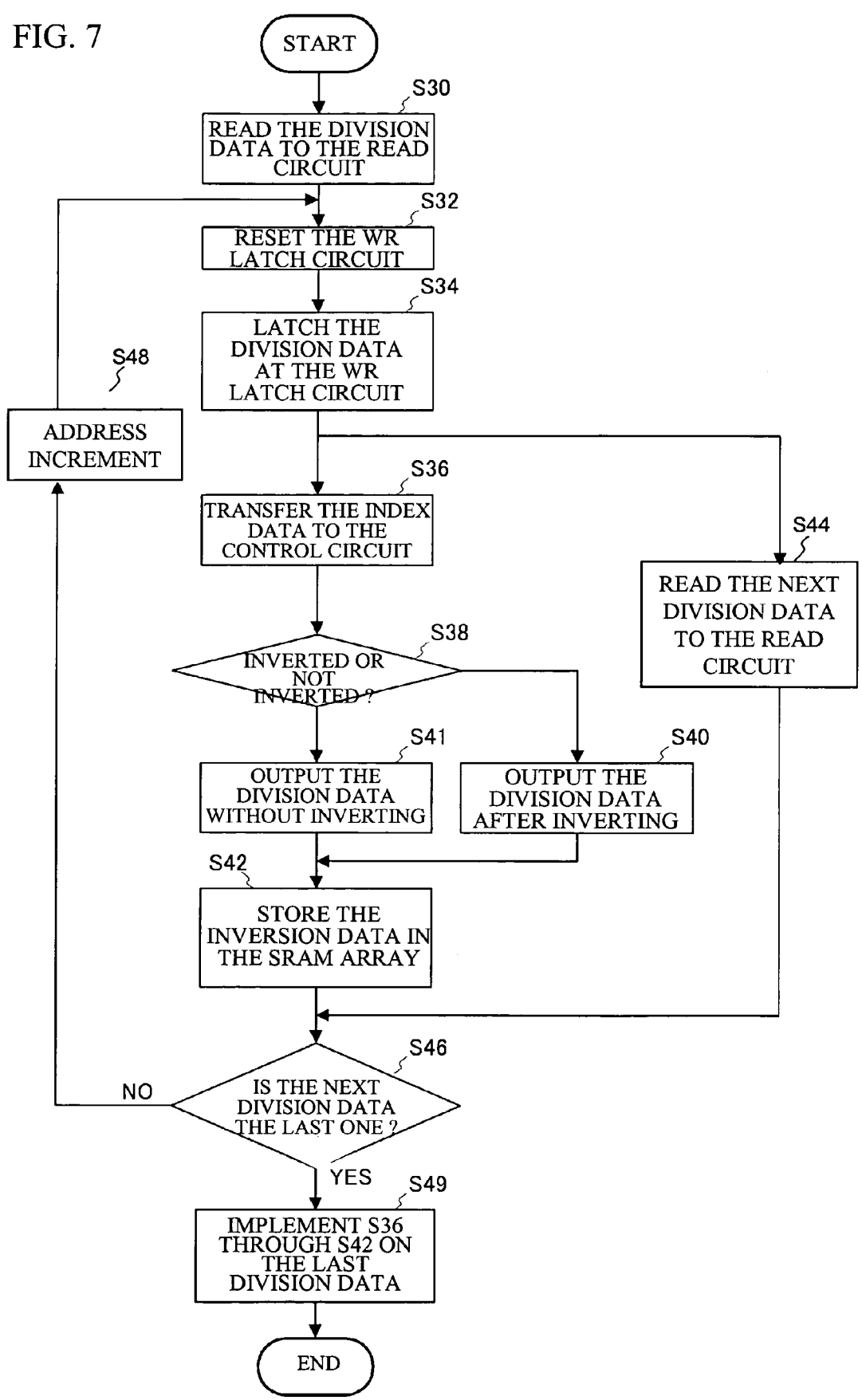
FIG. 7 is a flowchart of reading data from the memory cell array.
Figure 8:
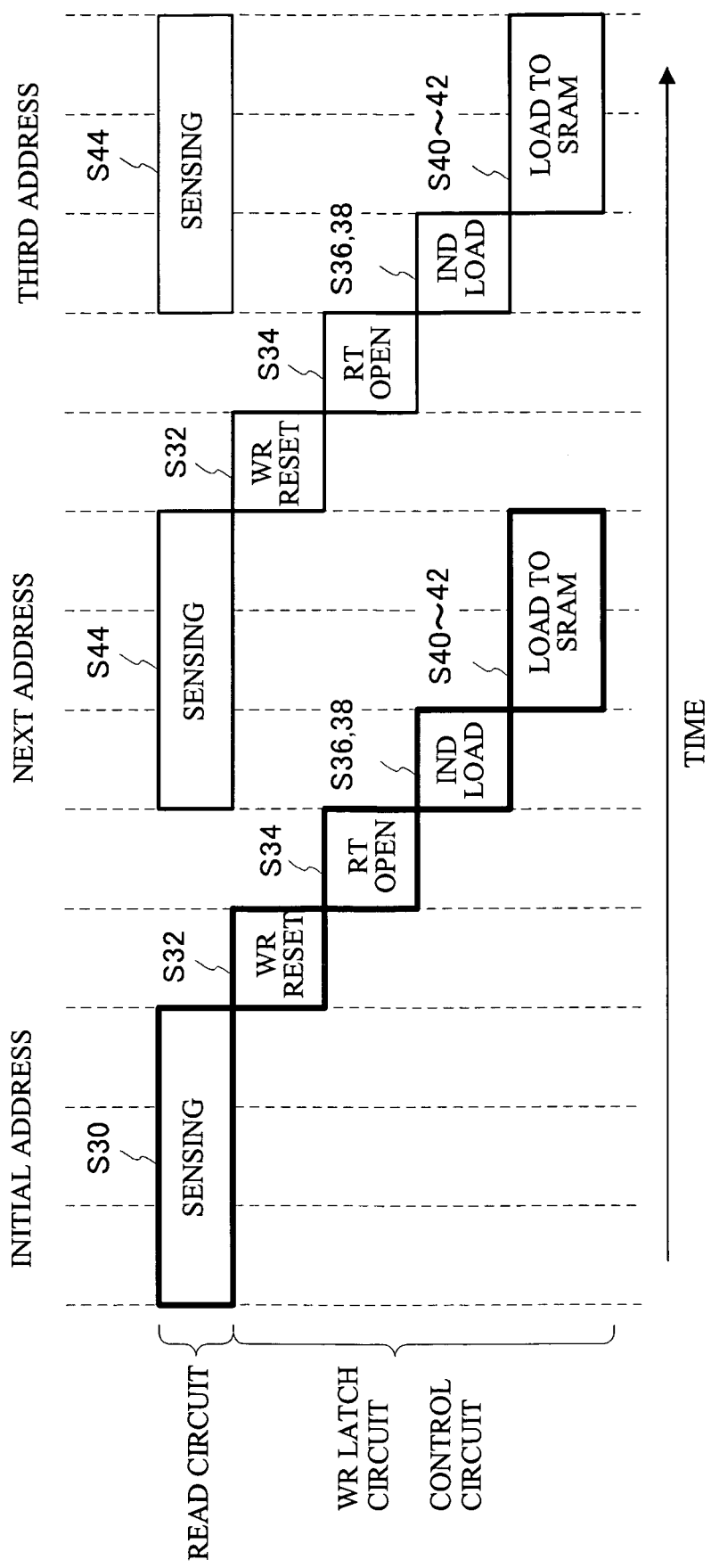
FIG. 8 is a timing chart of reading data from the memory cell array.

Next, a description will be given of the process flow when the data for one page is read from the memory cell array 10. FIG. 7 is a flowchart of reading the data, and FIG. 8 is a timing chart thereof. A node RT in FIG. 4 is at a low level, and the FET 31 is closed (off). Referring to FIG. 7 and FIG. 8, the read circuit 24 senses the division data and the index data of the initial address, out of the data for one page (step S30). Referring to FIG. 4, the node G is set at a high level, the node B is set at a low level, and the node C is set at a high level. Referring to FIG. 7 and FIG. 8, the WR latch circuit 30 resets the latch 35 (step S32: WR reset). Then, the node G is set at a low level. Referring to FIG. 4, the node RT is set at a high level, and the output from the sense amplifier 28 is transferred to the node C of the latch 35. By this, the division data and the corresponding index data are latched by the latch 35 (step S34: RT open). The node RT is set at a low level and the FET 31 is closed (off) to disconnect the sense amplifier 28 and the latch 35.

Referring to FIG. 7 and FIG. 8, next, step S44 is implemented, while step S36 through step S42 are being implemented. That is, the WR latch circuit 30 transfers the index data to the control circuit 60 (step S36: IND load). The control circuit 60 determines whether or not the division data is inverted (step S38: IND load) by use the corresponding index data. If it is determined that the division data is inverted, the WR latch circuit 30 inverts the division data and outputs such inverted division data to the RAMDAT (step S40: load to SRAM). That is to say, referring to FIG. 4, the node D is set at a high level and the node E is set at a low level to open the transfer gate 36. This causes the node B to be connected to the RAMDAT, the node B operating as a complementary node of the node C. By this, the division data is inverted and output to the RAMDAT. Referring to FIG. 7 and FIG. 8, if it is determined that the division data is not inverted, the WR latch circuit 30 does not invert the division data and outputs the division data that is not inverted to the RAMDAT (step S41: load to SRAM). That is to say, referring to FIG. 4, the node E is set at a high level and the node D is set at a low level to open the transfer gate 37. This causes the node C to be connected to the RAMDAT. In consequence, the division data is output to the RAMDAT without being inverted. Referring to FIG. 7 and FIG. 8, the division data in the RAMDAT (namely, the division data that is inverted or not inverted is referred to as inversion data) is stored in the SRAM array 50 (step S42: load to SRAM). Referring to FIG. 7 and FIG. 8, the read circuit 24 reads the division data of the next address, while the control circuit 60 and the WR latch circuit 30 are implementing step S36 through step S42 (step S44: sensing).

Next, the control circuit 60 determines whether the next division data is the last one (step S46). If it is No, the address sequencer 62 increments the address to obtain the address of the division data (step S48) and processing returns to step S32. If it is Yes at step S46, processing from step S36 through step S42 is implemented in the last division data in a similar manner (step S49). As stated, data for one page is stored in the SRAM array 50. The data for one page is output from the SRAM array 50 through the IO_SA(15:0) 52 to the outside. In this manner, the data for one page is read from the memory cell array 10.

The flash memory employed in the first embodiment includes: the bit detector 40 (detection circuit), which detects the total number of bits "0" in the division data to be written, the division data being data divided from the data to be programmed into the memory cell array 10, and compares the total number of "0" with a predetermined number of bits; the WR latch circuit 30 (latch circuit) that latches the division data that is inverted or not inverted (which is referred to as inversion data), in accordance with a comparison result of the bit detector 40; and the write circuit 22 coupled to the WR latch circuit 30 so as to program the inversion data into the memory cell array 10. Then, the control circuit 60 coupled to the bit detector 40, the WR latch circuit 30, and the write circuit 22 causes the bit detector 40 to detect the total number of bits in the next division data (namely, the division data to be programmed into the memory cell array 10 next time) to be written and to compare the total number of bits thereof with a predetermined number at step S20, while the inversion data is being programmed from the WR latch circuit 30 into the memory cell array 10 at step S18. By operating in this manner, when there are a large number of total bits to be written requiring a long programming time, the division data is inverted and such inverted division data is programmed, thereby reducing the programming time. As shown in FIG. 6, the step S20 through step S25 are implemented for the next division data, while the step S18 is being implemented. This can further shorten the programming time of the data into the memory cell array 10. Also, as represented by a dotted line starting before step S16 to step S20 in FIG. 5, before the inversion data is programmed into the memory cell array 10 (step S18), step S20 through step S25 may be implemented for the next division data, while the write circuit 22 is precharging the bit line to be connected to the memory cell into which the write circuit 22 is to program. This can further shorten the programming time.

Also, the flash memory employed in the first embodiment includes the index data region 30b (index latch circuit) of the WR latch circuit 30 that latches the index data indicative of whether the inversion data is the data inverted or not inverted, so that the bit detector 40 outputs the index data to the index data region 30b of the WR latch circuit 30, in accordance with the result of comparing the total number of the bits "0" with a predetermined number of bits. While programming the inversion data into the memory cell array 10, the write circuit 22 programs the index data from the index data region 30b of the WR latch circuit 30 into the memory cell array 10 concurrently. The index data is programmed into the memory cell array 10 in this manner, when the data is written into the memory cell array 10. This makes it possible to determine whether the division data is the data inverted or not inverted when the data is read from the memory cell array 10.

In addition, the flash memory employed in the first embodiment includes the transfer gates 36 and 37, which are switch circuits that transfer the inversion data to the WR latch circuit 30, as shown in FIG. 4. At step S20, the transfer gates 36 and 37 are off, while the bit detector 40 is detecting the total number of the bits "0" of the division data to be written and comparing the total number of the bits "0" with a predetermined number of bits. Further, at step S24 or step S25, either of the transfer gates 36 and 37 is kept on, while the inversion data is being transferred to the WR latch circuit 30. As stated, the transfer gates 36 and 37 are off, while the bit detector 40 is detecting the total number of bits in the division data to be written and comparing the total number of the bits with a predetermined number of bits. Therefore, the bit detector 40 can detect the total number of bits in the next division data to be written and to compare the total number of bits with a predetermined number of bits, while the inversion data of the WR latch circuit 30 is being programmed from the latch 35 into the memory cell array 10.

As shown in FIG. 4, the WR latch circuit 30 includes two nodes B and C that operate in a complementary manner, so that the division data is input into either the node B or the node C, in accordance with the comparison result of the bit detector 40. Thus, the division data is inverted or not inverted, and is latched as the inversion data. Data applied to the two nodes B and C that operate in a complementary manner, as described above, eliminates the necessity of a circuit to invert the division data. Accordingly, the chip area can be reduced.

The WR latch circuit 30 includes the latch 35 (circuit) that circularly connects the two inverters 32 and 34, and the two nodes that operate in a complementary manner are the node B and the node C. With such a simple configuration, the inversion data that is the division data inverted or not inverted can be latched by the WR latch circuit 30.

Furthermore, the flash memory employed in the first embodiment includes the SRAM array 50 (storage device) that stores the data to be programmed, the data being input from an external circuit, and outputs the division data to the RAMDAT coupled to the bit detector 40 and the WR latch circuit 30. The data for one page is latched by the SRAM array 50, making it possible to input data from an external circuit on a page basis and to program into the memory cell on division data basis.

The flash memory employed in the first embodiment includes: the read circuit 24 that reads the division data from the memory cell array 10, the division data being the divided data of the data to be read from the memory cell array 10; the control circuit 60 that determines whether the index data indicates the inversion or non-inversion at the time of programming the division data; and the WR latch circuit 30 that latches the division data read by the read circuit 24 and outputs the division data inverted or not inverted (referred to as inversion data), in accordance with a determination result of the control circuit 60 whether the division data is inverted or not inverted at the time of programming the division data. The read circuit reads the next division data from the memory cell array, while the control circuit 60 is determining whether the index data indicates the inversion or non-inversion. This can determine whether the division data is inverted or not inverted, while the division data is being programmed. If the division data is inverted, the division data may be returned to the original one to be output. Also, as shown in FIG. 8, step S44 for the next division data is implemented, while the step S36 through step S42 are being implemented. It is possible to shorten the time to read the data from the memory cell array 10.

In addition, the flash memory employed in the first embodiment includes the index data region 30b (index latch circuit) of the WR latch circuit that latches the index data, while the WR latch circuit 30 is latching the division data. At step S33 and step S44, the read circuit 24 reads the index data, while reading the division data from the memory cell array 10. At step S36, the control circuit 60 reads the index data from the index data region 30b (index latch circuit) of the WR latch circuit, and at step S38, the control circuit 60 determines whether the division data is inverted or not inverted at the time of writing, by use of the index data. In this manner, with the index data, it is possible to determine whether the division data is inverted or not inverted. Also, the index data and the division data are read from the memory cell array 10 simultaneously, thereby eliminating the necessity of reading the index data and the division data separately. The reading time can be shortened.

Furthermore, the flash memory employed in the first embodiment includes the FET 31 serving as a switch circuit to transfer the division data to the latch 35 of the WR latch circuit 30. At step S38, the FET 31 is off, while the control circuit 60 is determining whether the division data is inverted or not inverted at the time of being written. At step S34, the FET 31 is on, while the inversion data is being transferred from the read circuit 24 to the WR latch circuit 30. The FET 31 is off, while the control circuit 60 is determining whether the division data is inverted or not inverted at the time of being written. Therefore, the read circuit 24 can read the next division data from the memory cell array 10, while the control circuit 60 is determining whether the division data is inverted or not inverted when the division data is programmed.

Also, the WR latch circuit 30 includes the node B and the node C that operate in a complementary manner, and outputs the inversion data that is the division data inverted or not inverted, by outputting the division data from one of the two nodes B and C, in response to the index data. This eliminates the necessity of a circuit that inverts the division data by outputting from the node B and the node C that operate in a complementary manner, eliminating the necessity of the circuit that inverts the division data. It is therefore possible to reduce the chip area.

In addition, the WR latch circuit 30 includes the latch 35 (circuit) in which the inverters 32 and 34 are circularly connected, and the two nodes B and C are different nodes arranged between the inverters 32 and 34. With such a simple configuration, the WR latch circuit 30 is capable of outputting such latched division data that is inverted or not inverted.

Further, the flash memory employed in the first embodiment includes the SRAM array 50 that stores the inversion data output from the WR latch circuit 30 and outputs the data to be read from the memory cell array 10 to an external circuit. As stated, the data for one page is stored in the SRAM array 50, thereby making it possible to output to an external circuit on a page basis and to read from the memory cell on division data basis.

The first embodiment of the present invention employs an example of a virtual ground flash memory. However, the present invention may be applied to other SONOS type flash memories, floating gate flash memories, and other nonvolatile memories. However, it is difficult to program the data for one page in a short period of time, when, in particular, a virtual ground flash memory is used with a NAND interface. In such a case, it is possible to shorten the programming time by applying the present invention. Here, the external circuit may be any one of a processing circuit such as a CPU or the like in a semiconductor device equipped with the flash memory employed in the first embodiment and a processing circuit such as a CPU or the like outside a semiconductor device equipped with the flash memory.

Embodiments generally relate to semiconductor devices. More particularly, embodiments allow semiconductor devices to function with increased programming speed. In one implementation, the various embodiments are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive nagivation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells", each of which traditionally stores one bit of information. However, newer flash memory devices, such as MirrorBit® Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit® technology has several key advantages. For example, flash memory that utilizes MirrorBit® technology is capable of burst-mode access as fast as 80 MHz, page access times as fast as 25 ns, simultaneous read-write operation for combined code and data storage, and low standby power (e.g., 1 µA).

Figure 9:
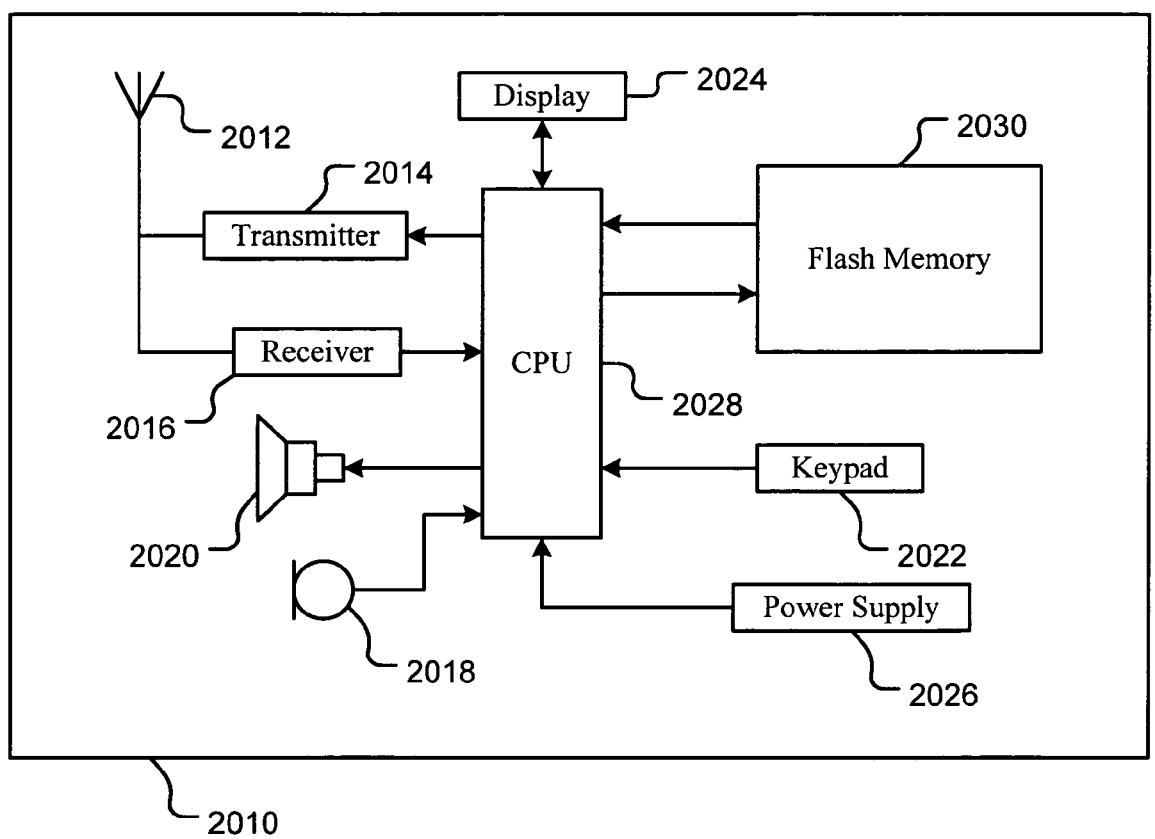
FIG. 9 illustrates a block diagram of a conventional portable phone, upon which embodiments may be implemented.

FIG. 9 shows a block diagram of a conventional portable telephone 2010 (e.g., cell phone, cellular phone, mobile phone, internet protocol phone, wireless phone, etc.), upon which embodiments can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes a memory cell array; a bit detection portion for detecting the number of bits to be written as division data that is divided from data to be programmed into the memory cell array; a bit comparison portion for comparing the detected number of bits with a predetermined number of bits; an inversion portion for inverting the division data to produce inversion data in accordance with a result of comparing the detected number of bits with the predetermined number of bits; and a programming portion for programming the inversion data into the memory cell array. The bit detection portion is further operable to detect the number of bits to be written as next division data and the comparison portion is further operable to compare the number of bits of next division data with the predetermined number of bits, while the programming portion is concurrently programming the inversion data into the memory cell array. According to various embodiments, it is possible to provide a semiconductor device, such as flash memory, that has increased programming spped. The present invention also provides methods of controlling such a semiconductor device. The increased programming speed for the flash memory allows for various devices, such as mobile phones, cellular phones, internet protocol phones, and/or wireless phones to function more efficiently.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a less expensive flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 10:
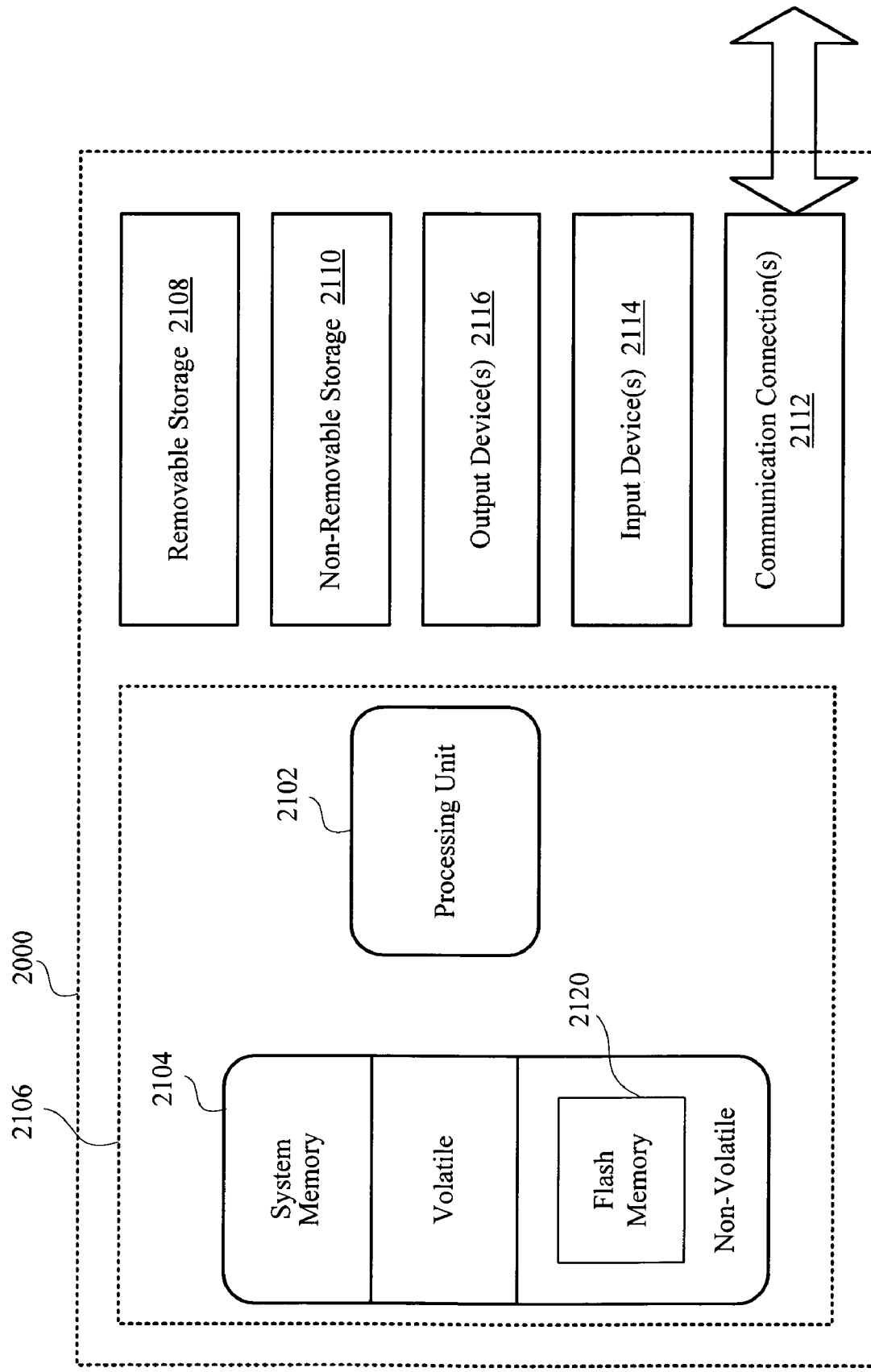
FIG. 10 illustrates a block diagram of a computing device, upon which embodiments may be implemented.

FIG. 10 illustrates a block diagram of a computing device 2100, upon which embodiments of the present claimed subject matter can be implemented. Although computing device 2100 is shown and described in FIG. 10 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 10.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

Figure 11:
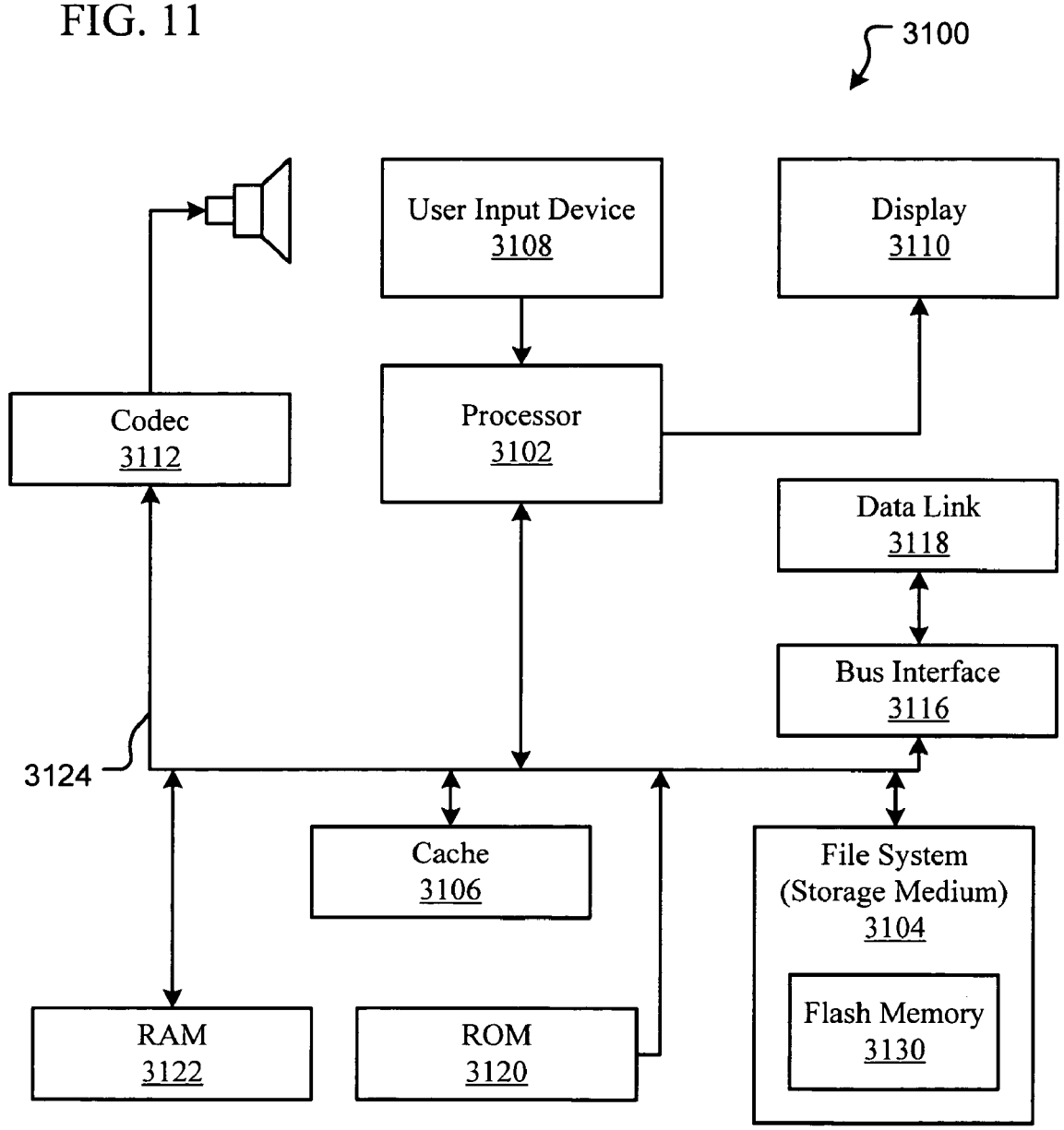
FIG. 11 illustrates an exemplary portable multimedia device, or media player, in accordance with various embodiments of the present invention.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 11 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 17 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: a plurality of stacked semiconductor chips, at least one of the semiconductor chips including a semiconductor substrate, a first insulating layer that is provided on side faces of the semiconductor substrate and has concavities formed on side faces thereof, and first metal layers that are provided in center portions of inner side faces of the concavities; and second metal layers that are provided in the concavities and are connected to the first metal layers formed on the at least one of the semiconductor chips. According to various embodiments, it is possible to provide a semiconductor device, such as flash memory, that has increased programming spped. The present invention also provides methods of controlling such a semiconductor device. The increased programming speed for the flash memory allows for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones to function more efficiently. Further, in one embodiment, the flash memory 2120 utilizes MirrorBit® technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Users would also benefit from reduced memory read time and reduced cost.

FIG. 11 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, the flash memory 3130 comprises: a memory cell array; a bit detection portion for detecting the number of bits to be written as division data that is divided from data to be programmed into the memory cell array; a bit comparison portion for comparing the detected number of bits with a predetermined number of bits; an inversion portion for inverting the division data to produce inversion data in accordance with a result of comparing the detected number of bits with the predetermined number of bits; and a programming portion for programming the inversion data into the memory cell array. The bit detection portion is further operable to detect the number of bits to be written as next division data and the comparison portion is further operable to compare the number of bits of next division data with the predetermined number of bits, while the programming portion is concurrently programming the inversion data into the memory cell array. According to various embodiments, it is possible to provide a semiconductor device, such as flash memory, that has increased programming spped. The present invention also provides methods of controlling such a semiconductor device. The increased programming speed for the flash memory allows for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones to function more efficiently. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that connect to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

Finally, various aspects of the present invention are summarized in the following.

According to a first aspect of the present invention, there is provided a semiconductor device including: a memory cell array comprising a plurality of nonvolatile memory cells; a detection circuit detecting the number of bits to be written as division data that is divided from data to be programmed into the memory cell array and comparing the number of bits with a predetermined number of bits; a latch circuit latching inversion data, which is either the division data inverted or not inverted in accordance with a result of comparing the number of bits with the predetermined number of bits; a write circuit coupled to the latch circuit and programming the inversion data into the memory cell array; and a control circuit coupled to the detection circuit, the latch circuit, and the write circuit to cause the detection circuit to detect the number of bits to be written as next division data and to compare the number of bits of the next division data with the predetermined number of bits, while concurrently controlling the write circuit to program the inversion data into the memory cell array.

The above-described semiconductor device may further include an index latch circuit latching index data indicative of whether the inversion data is the division data inverted or not inverted. The detection circuit may output the index data to the index latch circuit in response to the result of comparing the number of bits with the predetermined number of bits; and the write circuit may program the index data from the index latch circuit into the memory cell array, while programming the inversion data into the memory cell array. With this configuration, the index data is programmed into the memory cell array, while the data is being written into the memory cell array. Therefore, it is possible to determine, for example, that the division data is inverted or not inverted by use of the index data, when the data is read from the memory cell array.

The above-described semiconductor device may further include a switch circuit transferring the inversion data to the latch circuit. The switch circuit may be switched off, while the detection circuit is detecting the number of bits to be written as the division data and comparing the number of bits with the predetermined number of bits, and the switch circuit is switched on, while transferring the inversion data to the latch circuit. With this configuration, the switch circuit is off, while the inversion data of the latch circuit is being programmed from the latch circuit into the memory cell array, thereby making the detection circuit compare the total number of bits to be written in the next division data with a predetermined number of bits.

The above-described semiconductor device may further include a storage device storing the data to be programmed, the data being received from an external circuit, and outputting the division data to the detection circuit and the latch circuit. With this configuration, the input from the external circuit is performed on data to be programmed basis, and programming into the memory cell array is performed on division data basis.

In the above-described semiconductor device, the write circuit may pre-charge a bit line to be connected to one of the plurality of memory cells in the memory cell array, into which the inversion data is to be programmed, before programming the inversion data into the memory cell array, and the control circuit may control the detection circuit to detect the number of bits to be written as next division data and to compare the number of bits of the next division data with the predetermined number of bits, while the write circuit is precharging the bit line. With this configuration, while the write circuit is precharging, the detection circuit is detecting the total number of bits in the next division data to be written and comparing the number of bits with the predetermined number of bits. This can further reduce the programming time of the data into the memory cell array.

According to a second aspect of the present invention, there is provided a semiconductor device including: a memory cell array comprising a plurality of nonvolatile memory cells; a detection circuit detecting the number of bits to be written as division data that is divided from data to be programmed into the memory cell array and comparing the number of bits with a predetermined number of bits; a latch circuit latching inversion data, which is either the division data inverted or not inverted in accordance with a result of comparing the number of bits with the predetermined number of bits; and a write circuit coupled to the latch circuit and programming the inversion data into the memory cell array. The latch circuit may include a pair of nodes operating in a complementary manner, and latches the inversion data that is either the division data inverted or not inverted by inputting the division data into either of the pair of nodes in accordance with the result of comparing the number of bits with the predetermined number of bits.

In the above-described semiconductor device, the latch circuit may further include a circuit having two inverter circuits connected circularly; and each of the pair of nodes may be respectively arranged between the two inverter circuits. With this configuration, with such a simple configuration, the inversion data that is the division data inverted or not inverted can be latched by the latch circuit.

According to a third aspect of the present invention, there is provided a semiconductor device including: a memory cell array comprising a plurality of nonvolatile memory cells; a read circuit reading division data that is divided from data to be read from the memory cell array; a control circuit determining whether index data indicates that the division data is inverted or not inverted when the division data is programmed; and a latch circuit latching the division data read by the read circuit and outputting inversion data that is either the division data inverted or not inverted in accordance with a result of determining whether the index data indicates that the division data is inverted or not inverted. The read circuit may read next division data from the memory cell array, while the control circuit is determining whether the index data indicates that the division data is inverted or not inverted.

The above-described semiconductor device may further include an index latch circuit latching the index data, while the latch circuit is latching the division data. The read circuit may read the index data, while reading the division data from the memory cell array; and the control circuit may read the index data from the index latch circuit and determines whether the index data indicative of whether the division data is inverted or not inverted when the division data is written, in response to the index data. With this configuration, with the index data, it is possible to determine whether the division data is inverted or not inverted. In addition, the index data does not have to be read from the division data separately, thereby shortening the reading time.

The above-described semiconductor device may further include a switch circuit transferring the division data to the latch circuit. The switch circuit may be switched off, while the control circuit is determining whether the index data indicates that the division data is inverted or not inverted, and the switch circuit is switched on, while transferring the division data from the read circuit to the latch circuit. With this configuration, the switch circuit is off, while the control circuit is determining whether the division data is inverted or not inverted when the division data is programmed. Therefore, the read circuit can read the next division data from the memory cell array.

The above-described semiconductor device may further include a storage device storing the inversion data output from the latch circuit and outputting the data to be read from the memory cell array, including the inversion data, to an external circuit. With this configuration, the output to the external circuit is performed on the data to be read basis, and the reading from the memory cell array is performed on division data basis.

According to a fourth aspect of the present invention, there is provided a semiconductor device including: a memory cell array comprising a plurality of nonvolatile memory cells; a read circuit reading division data that is divided from data to be read from the memory cell array; a control circuit determining whether index data indicates that the division data is inverted or not inverted when the division data is programmed; and a latch circuit latching the division data read by the read circuit and outputting inversion data that is either the division data inverted or that not inverted in accordance with a result of determining whether the index data indicates that the division data is inverted or not inverted. The latch circuit may include a pair of nodes operating in a complementary manner, and outputs the inversion data that is either the division data inverted or not inverted by outputting the division data from either of the pair of nodes in response to the index data.

In the above-described semiconductor device, the latch circuit may further include a circuit having two inverter circuits connected circularly; and each of the pair of nodes may be respectively arranged between the two inverter circuits. With this configuration, with such a simple configuration, it is possible to output the inversion data that is the division data inverted or not inverted from the latch circuit.

According to a fifth aspect of the present invention, there is provided a method for controlling a semiconductor device comprising a memory cell array having a plurality of nonvolatile memory cells, the method including: detecting the number of bits to be written as division data that is divided from data to be programmed into the memory cell array; comparing the number of bits with a predetermined number of bits; inverting or not inverting the division data to produce inversion data in accordance with a result of comparing the number of bits with the predetermined number of bits; and programming the inversion data into the memory cell array. Detecting the number of bits to be written as next division data and comparing the number of bits of next division data with the predetermined number of bits, while concurrently programming the inversion data into the memory cell array.

According to a sixth aspect of the present invention, there is provided a method for controlling a semiconductor device comprising a memory cell array having a plurality of nonvolatile memory cells, the method including: reading division data that is divided from data to be read from the memory cell array; determining whether index data indicates that the division data is inverted or not inverted when the division data is programmed; and inverting or not inverting the division data in accordance with a result of determining whether the index data indicates that the division data is inverted or not inverted. Reading next division data from the memory cell array is performed, while determining whether the index data indicates that the division data is inverted or not inverted.

According to an aspect of the present invention, it is possible to provide a semiconductor device and a control method therefor, by which the programming time into the memory cell array can be shortened.

Although a few preferred embodiments of the present invention have been shown and described, it would be appreciated by those skilled in the art that changes may be made in these embodiments without departing from the principles and spirit of the invention, the scope of which is defined in the claims and their equivalents.

The invention claimed is:

1. A semiconductor device comprising:
    a memory cell array comprising a plurality of nonvolatile memory cells;
    a detection circuit detecting a number of bits to be written as division data that is divided from data to be programmed into the memory cell array and comparing the number of bits with a predetermined number of bits;
    a latch circuit latching inversion data, which is either the division data inverted or not inverted in accordance with a result of comparing the number of bits with the predetermined number of bits, wherein the latch circuit includes a pair of nodes operating in a complementary manner, and latches the inversion data that is either the division data inverted or not inverted by inputting the division data into either of the pair of nodes in accordance with the result of comparing the number of bits with the predetermined number of bits;
    a write circuit coupled to the latch circuit and programming the inversion data into the memory cell array; and
    a control circuit coupled to the detection circuit, the latch circuit, and the write circuit to cause the detection circuit to detect the number of bits to be written as next division data and to compare the number of bits of the next division data with the predetermined number of bits, while concurrently controlling the write circuit to program the inversion data into the memory cell array.

2. The semiconductor device as claimed in claim 1, further comprising an index latch circuit latching index data indicative of whether the inversion data is the division data inverted or not inverted,
    wherein the detection circuit outputs the index data to the index latch circuit in response to the result of comparing the number of bits with the predetermined number of bits; and
    wherein the write circuit programs the index data from the index latch circuit into the memory cell array, while programming the inversion data into the memory cell array.

3. The semiconductor device as claimed in claim 2, further comprising a switch circuit transferring the inversion data to the latch circuit;
    wherein the switch circuit is switched off, while the detection circuit is detecting the number of bits to be written as the division data and comparing the number of bits with the predetermined number of bits, and the switch circuit is switched on, while transferring the inversion data to the latch circuit.

4. The semiconductor device as claimed in claim 3, further comprising a storage device storing the data to be programmed, the data being received from an external circuit, and outputting the division data to the detection circuit and the latch circuit.

5. The semiconductor device as claimed in claim 4,
    wherein the write circuit pre-charges a bit line to be connected to one of the plurality of memory cells in the memory cell array, into which the inversion data is to be programmed, before programming the inversion data into the memory cell array, and wherein the control circuit controls the detection circuit to detect the number of bits to be written as next division data and to compare the number of bits of the next division data with the predetermined number of bits, while the write circuit is precharging the bit line.

6. A semiconductor device comprising:

a memory cell array comprising a plurality of nonvolatile memory cells;

a detection circuit detecting a number of bits to be written as division data that is divided from data to be programmed into the memory cell array and comparing the number of bits with a predetermined number of bits;

a latch circuit latching inversion data, which is either the division data inverted or not inverted in accordance with a result of comparing the number of bits with the predetermined number of bits; and a write circuit coupled to the latch circuit and programming the inversion data into the memory cell array, wherein the latch circuit includes a pair of nodes operating in a complementary manner, and latches the inversion data that is either the division data inverted or not inverted by inputting the division data into either of the pair of nodes in accordance with the result of comparing the number of bits with the predetermined number of bits.

7. The semiconductor device as claimed in claim 6, wherein the latch circuit further includes a circuit having two inverter circuits connected circularly; and wherein each of the pair of nodes is respectively arranged between the two inverter circuits.

8. A method for controlling a semiconductor device comprising a memory cell array having a plurality of nonvolatile memory cells, the method comprising:

detecting a number of bits to be written as division data that is divided from data to be programmed into the memory cell array;

comparing the number of bits with a predetermined number of bits;

inverting or not inverting the division data to produce inversion data in accordance with a result of comparing the number of bits with the predetermined number of bits; and programming the inversion data into the memory cell array, wherein the inverting or not inverting the division data is performed using a latch circuit which comprises a pair of nodes operating in a complementary manner, and latches the inversion data that is either the division data inverted or not inverted by inputting the division data into either of the pair of nodes in accordance with the result of comparing the number of bits with the predetermined number of bits.

9. A wireless communications device, comprising:

a flash memory comprising:

a memory cell array;

a bit detection portion for detecting the number of bits to be written as division data that is divided from data to be programmed into the memory cell array;

a bit comparison portion for comparing the detected number of bits with a predetermined number of bits;

an inversion portion for inverting the division data to produce inversion data in accordance with a result of comparing the detected number of bits with the predetermined number of bits; and a programming portion for programming the inversion data into the memory cell array;

wherein the bit detection portion is further operable to detect the number of bits to be written as next division data, the bit comparison portion is further operable to compare the number of bits of next division data with the predetermined number of bits, and the inversion portion includes a pair of nodes operating in a complementary manner, and latches the inversion data that is either the division data inverted or not inverted by inputting the division data into either of the pair of nodes in accordance with the result of comparing the number of bits with the predetermined number of bits while the programming portion is concurrently programming the inversion data into the memory cell array;

a processor;

a communications component;

a transmitter;

a receiver; and an antenna connected to the transmitter circuit and the receiver circuit.

10. The wireless communications device of claim 9, wherein said flash memory is NAND flash memory.

11. The wireless communications device of claim 9, wherein said flash memory is NOR flash memory.

12. The wireless communications device of claim 9, wherein said flash memory comprises at least one memory cell operable to store more than one bit.

13. A computing device comprising:

a processor;

an input component;

an output component; and a memory comprising:

a volatile memory; and a flash memory comprising:

a memory cell array;

a bit detection portion for detecting the number of bits to be written as division data that is divided from data to be programmed into the memory cell array;

a bit comparison portion for comparing the detected number of bits with a predetermined number of bits;

an inversion portion for inverting the division data to produce inversion data in accordance with a result of comparing the detected number of bits with the predetermined number of bits; and a programming portion for programming the inversion data into the memory cell array;

wherein the bit detection portion is further operable to detect the number of bits to be written as next division data, the bit comparison portion is further operable to compare the number of bits of next division data with the predetermined number of bits, and the inversion portion includes a pair of nodes operating in a complementary manner, and latches the inversion data that is either the division data inverted or not inverted by inputting the division data into either of the pair of nodes in accordance with the result of comparing the number of bits with the predetermined number of bits while the programming portion is concurrently programming the inversion data into the memory cell array.

14. The computing device of claim 13, wherein said computing device is a personal computer (PC).

15. The computing device of claim 13, wherein said computing device is a personal digital assistant (PDA).

16. The computing device of claim 13, wherein said computing device is a gaming system.

17. A portable media player comprising:
a processor;
a cache;
a user input component;
a coder-decoder component; and
a memory comprising:
  a flash memory comprising:
    a memory cell array;
    a bit detection portion for detecting the number of bits to be written as division data that is divided from data to be programmed into the memory cell array;
    a bit comparison portion for comparing the detected number of bits with a predetermined number of bits;
    an inversion portion for inverting the division data to produce inversion data in accordance with a result of comparing the detected number of bits with the predetermined number of bits; and
    a programming portion for programming the inversion data into the memory cell array;
    wherein the bit detection portion is further operable to detect the number of bits to be written as next division data, the bit comparison portion is further operable to compare the number of bits of next division data with the predetermined number of bits, and the inversion portion includes a pair of nodes operating in a complementary manner, and latches the inversion data that is either the division data inverted or not inverted by inputting the division data into either of the pair of nodes in accordance with the result of comparing the number of bits with the predetermined number of bits while the programming portion is concurrently programming the inversion data into the memory cell array.

18. The portable media player of claim 17, wherein said portable media player is a portable music player.

19. The portable media player of claim 17, wherein said portable media player is a portable video player.

* * * * *